United States Patent [19]
Yang et al.

[11] Patent Number: 5,747,368
[45] Date of Patent: May 5, 1998

[54] PROCESS FOR MANUFACTURING CMOS DEVICE

[75] Inventors: Ching-Nan Yang, Jung-He; Li-Chun Peng, Hsin-Chu Shian, both of Taiwan

[73] Assignee: Mosel Vitelic Inc., Hsin Chu, Taiwan

[21] Appl. No.: 720,762

[22] Filed: Oct. 3, 1996

[51] Int. Cl.$^6$ .............................................. H01L 21/8238
[52] U.S. Cl. .......................... 438/217; 438/228; 438/231
[58] Field of Search .................................. 437/34, 56, 57, 437/58, 59, 41 RCM, 238; 438/217, 228, 231, 289

[56] References Cited

U.S. PATENT DOCUMENTS

| | | | |
|---|---|---|---|
| 4,966,866 | 10/1990 | Mikata et al. | 437/34 |
| 5,141,890 | 8/1992 | Haken | 437/57 |
| 5,270,233 | 12/1993 | Hamatake | 437/57 |
| 5,362,670 | 11/1994 | Iguchi et al. | 437/56 |
| 5,464,789 | 11/1995 | Saito | 437/34 |
| 5,521,106 | 5/1996 | Okabe | 437/34 |

Primary Examiner—Michael Trinh
Attorney, Agent, or Firm—Madson & Metcalf

[57] ABSTRACT

A process for manufacturing a CMOS device is disclosed. The process includes steps of forming a field oxide over a pad oxide excluding an active area in order to function the field oxide as an isolation layer; forming a gate oxide on the active area; forming a gate conducting layer over the field oxide and the gate oxide; forming a photoresist on the gate conducting layer; removing a portion of the photoresist and executing a first ion implantation in order to regulate a first threshold voltage of the one of the p-type and the n-type MOS regions; selectively forming an oxide on the gate conducting layer on the one of the p-type and the n-type MOS regions; eliminating a remaining portion of the photoresist on the other one of the p-type and the n-type MOS regions and executing a second ion implantation in order to regulate a second threshold voltage of the the other one of the p-type and the n-type MOS regions; and eliminating the oxide on the one of the p-type and the n-type MOS regions and forming gates, sources and drains in the CMOS device by patterning and etching the gate conducting layer.

33 Claims, 6 Drawing Sheets

5,747,368

PROCESS FOR MANUFACTURING CMOS DEVICE

FIELD OF THE INVENTION

The present invention relates to a semiconductor device, especially to a manufacturing process for fabricating a CMOS (Complementary Metal-Oxide Semiconductor) device.

BACKGROUND OF THE INVENTION

Since the electrical energy consumed by the COMS device composed by NMOS (N-channel Metal-Oxide Semiconductor) and PMOS (P-channel Metal-Oxide Semiconductor) during operation is little. Therefore, in nowadays manufacturing process of a semiconductor device, the CMOS device is suitable for being employed to the design and manufacturing of the VLSIC (Very Large Scale Integrated Circuit) or ULSIC (Ultra large Scale Integrated Circuit) having both thereon a relatively higher integration.

Basically, there are three kinds of essential structure for CMOS device:
(1) p well CMOS device;
(2) n well CMOS device; and
(3) a twin well CMOS device.

No matter what kind of the structure of the CMOS device is, the channels' length of the PMOS or the NMOS are becoming shorter as the dimension of the fabricated CMOS device is requested to become smaller. Particularly, as the channel length is less than 1.5 μm, a short channel effect will evidently appear, and therefore the drain current of the MOS device is out of control from the gate voltage.

To overcome the aforementioned defects induced by the short channel effect, an ion implantation is thus being executed in order to increase the surface doping of the semiconductor, and accordingly restrain the depletion region do not diffuse to the channel and raise the threshold voltage Vt.

However, if the contents of semiconductor dopant respectively contained in the PMOS and the NMOS composing the CMOS device, are not matched to each other, then the respective threshold voltages of the PMOS and the NMOS are accordingly not similar, and therefore a trouble will be encountered during the operation of the CMOS device. Consequently, an ion implantation for regulating a threshold voltage will be proceeded in order that the respective threshold voltages of the PMOS and the NMOS can match each other before forming a gate on the CMOS device.

Generally, in manufacturing the CMOS device, a field oxide (FOX) is frequently used as an isolation between respective transistors. However, a disliked capacitance-liked effect occurred among the Metal layer, the field oxide and the silicon substrate, frequently results from a metal conductive wire passed through the field oxide. Hence, to preventing the abovementioned defects, a channel stop containing a dopant having a very high consistency is doped before forming a gate on the CMOS device to the region under the field oxide in order to avoid the isolating effects between respective transistors being spoiled.

Furthermore, in order to resolve a punchthrough effect, a dopant doping is also performed before the gate is formed on the CMOS device.

Consequently, the conventional process for manufacturing the CMOS device includes at least ten different steps of the photolithography and the etching processes. Moreover, if the processes of the threshold voltage regulation, the channel stop creation and the punchthrough resolution by utilizing the ion implantation before forming the gate on the CMOS device are added, the photolithography and the etching processes during fabrication are thus unavoidably increased, and therefore the complexity and cost for manufacturing a CMOS device are raised.

Accordingly, how to reduce or eliminate the manufacturing steps for fabricating a CMOS device, especially to decrease the photolithography and the etching process required in the manufacturing process becomes a major object for the relevant researchers.

As is well known, when performing the conventional CMOS manufacturing method, if the device dimension is not obviously miniaturized, then merely the ion implantation is needed without evidently increasing the photolithography and the etching processes for regulating the threshold voltage, forming the channel stop or solving the punchthrough effect, and accordingly the characteristics of the CMOS device can be effectively improved.

As the dimensions and the characteristics of the CMOS device are concurrently to be requested for miniaturized and promoting, the ion implantation aforementioned for being executed in the NMOS will also have to be performed on the PMOS. However, under the consideration of promoting the device's characteristics, the steps required for fabricating the CMOS device are therefore increased, and certainly the manufacturing time and cost are unable to be reduced.

Furthermore, for more explicit illustrating the conventional manufacturing process, a process employed for forming a CMOS device having thereon twin tubs is taken as an instance.

Please refer to FIGS. 1(a)–1(i), which are schematic diagrams showing the conventional manufacturing processes for forming a CMOS device having a twin well.

In FIG. 1(a) it includes the following steps:
Forming a pad oxide 2 over a silicon substrate 1;
Forming a dielectric layer 3 on the pad oxide 2; and
Using the photolithography and the etching technique to remove a portion of the dielectric layer 3, and accordingly defines a pair of active areas 31 under the remaining portion of the dielectric layer 3;

FIG. 1(b) depicts that:
Utilizing the photolithography and the etching technique to create a first photoresist mask layer 4 on a portion of the active area 31;

FIG. 1(c) contains the following steps:
Performing a first ion implantation 51 to pre-deposit the n-type ions in the portion nW of the silicon substrate 1, which is not masked by the photoresist mask layer 4;

Executing a second ion implantation 52 to form a channel stop CNn in a region not masked by the first photoresist mask layer 4; and Executing a third ion implantation 53 to accomplish an ion implantation process forming a punchthrough prevention region comprising ions Ptn in a region not masked by the first photoresist mask layer 4;

FIG. 1(d) includes the following steps:
Removing the first photoresist mask layer 4 and using the photolithography and the etching technique to create a second photoresist mask layer 6 on a region of the active area 31, which is not masked by the first photoresist mask layer 4;

Executing a fourth ion implantation 54 to pre-deposit the p-type ions in the region pW of the silicon substrate 1, which is masked by the second photoresist mask layer 6;

Performing a fifth ion implantation 55 to form a channel stop CNp in a region not masked by the second photoresist mask layer 6; and Executing a sixth ion implantation 56 to accomplish an ion implantation process forming a punchthrough prevention region comprising ions Ptn in a region not masked by the second photoresist mask layer 6;

FIG. 1(e) has the following steps:

Removing the second photoresist mask layer 6;

Utilizing the superfluous portion of the dielectric layer 31 not been removed as a mask to form a field oxide 7 on an exposed pad oxide 21 excluding the active area 31 in order to function the field oxide 7 as an isolation layer and respectively drive in and diffuse the n-type ions and the p-type ions of the silicon substrate 1 to create n well nW and p well pW in order to form a p-type and an n-type MOS regions; and Forming a sacrificial oxide 8 over the field oxide 7 and the superfluous portion of the dielectric layer 31 in order to eliminate a white ribbon effect caused during forming the field oxide 7;

FIG. 1(f) contains the following steps:

Employing the photolithography and etching technique to form a third photoresist mask layer 9 on the n-type MOS region; and Executing a seventh ion implantation 57 to regulate a threshold voltage of the p-type MOS region;

FIG. 1(g) includes the following steps:

Removing the third photoresist mask layer 9;

Utilizing the photolithography and etching technique to form a fourth photoresist mask layer 10 over the p-type MOS region; and Executing a eighth ion implantation 58 to regulate a threshold voltage of the n-type MOS region;

FIG. 1(h) has the following steps:

Removing the fourth photoresist mask layer 10; and

Removing the sacrificial oxide 8, the superfluous portion of the dielectric layer in the active area 31 and the pad oxide 22 under the superfluous portion of the dielectric layer; and The operating steps depicted in FIG. 1(i) are:

Forming a gate oxide 11 on the active area 31; and

Forming a gate conductive layer 12 over the field oxide 7 and the gate oxide 11.

According to the aforementioned descriptions of the conventional CMOS device manufacturing processes, it can be realized that for concurrently meeting the requirements of miniaturized the device's dimension and promoting the performances of the CMOS device, the characteristics of the NMOS and the PMOS have to be regulated, and therefore the number of the operating steps employed by the conventional processes including the required photolithography and the etching processes are certainly doubled over that of only regulating the characteristics of the NMOS or the PMOS in the conventional CMOS device manufacturing process. Besides, to form the channel stop and the punchthrough effect, it is necessary to execute two respective ion implantations. In short terms, the conventional manufacturing processes aforementioned are not only wasting time and money but increasing the complexity of the manufacturing process.

SUMMARY OF THE INVENTION

The major object of the present invention is to disclose a process for manufacturing a CMOS device, which will not increase the required operation steps of the photolithography and the etching process.

The other object of the present invention is to provide a process for manufacturing a CMOS device, which can concurrently accomplish the forming of the channel stop and the ion implantation forming a punchthrough prevention region.

In accordance with a process for manufacturing a CMOS device having thereon a silicon substrate and a pair of active area used to form at least a p-type and an n-type MOS regions, it includes (a) forming a field oxide over a pad oxide excluding the active area in order to function the field oxide as an isolation layer, (b) forming a gate oxide on the active area, (c) forming a gate conducting layer over the field oxide and the gate oxide, (d) forming a photoresist on the gate conducting layer, (e) executing a first ion implantation in order to form a first channel stop in the one of the p-type and the n-type MOS regions and regulate a first threshold voltage and a punchthrough voltage of the one of the p-type and the n-type MOS regions, (f) selectively forming an oxide on the gate conducting layer on the one of the p-type and the n-type MOS regions, (g) eliminating a remaining portion of the photoresist on the other one of the p-type and the n-type MOS regions and executing a second ion implantation in order to form a second channel stop in the other one of the p-type and the n-type MOS regions and regulate a second threshold voltage of the other one of the p-type and the n-type MOS regions, and (h) eliminating the oxide on the one of the p-type and the n-type MOS regions and forming a gate, a source and a drain on the CMOS device.

In accordance with another aspect of the present invention, the CMOS device is a CMOS device having at least a twin well thereon, the p-type MOS region includes an n well and the n-type MOS region has a p well.

In accordance with another aspect of the present invention, before step (a) the process further includes following steps: (a1) forming the pad oxide over the silicon substrate, (a2) forming an dielectric layer on the pad oxide, (a3) eliminating a portion of the dielectric layer for defining the active area, and (a4) forming the n well and the p well over the silicon substrate under the active area.

In accordance with another aspect of the present invention, the pad oxide is formed by a heat oxidation.

In accordance with another aspect of the present invention, the heat oxidation is one of a dry oxidation and a wet oxidation.

In accordance with another aspect of the present invention, a thickness of the pad oxide between about one hundred Å to about one thousand Å.

In accordance with another aspect of the present invention, the dielectric layer is formed by a Low Pressure Chemical Vapor Deposition (LPCVD).

In accordance with another aspect of the present invention, the dielectric layer is $Si_3N_4$.

In accordance with another aspect of the present invention, a thickness of the dielectric layer in step (a2) is about 1000 to about 2000 Å.

In accordance with another aspect of the present invention, the portion of the dielectric layer in step (a3) is eliminated by a photolithography and an etching technique.

In accordance with another aspect of the present invention, step (a4) further includes following steps: (a41) forming a first photoresist mask layer on a portion of the active area, (a42) utilizing an ion implantation for pre-depositing n-type ions in a first portion of the silicon substrate, which is not masked by the first photoresist mask layer, (a43) eliminating the first photoresist mask layer and forming a second photoresist mask layer on a portion of the active area, which is not masked by the first photoresist mask layer, (a44) utilizing an ion implantation for pre-depositing p-type ions on a second portion of the silicon substrate, which is not masked by the second photoresist mask layer and (a45) removing the second photoresist mask layer and utilizing a heat diffusion to execute a drive-in process in order that the n-type ions and the p-type ions both distributed on the silicon substrate respectively become the n well and the p well by diffusion, and accordingly respectively form the p-type and the n-type MOS regions.

In accordance with another aspect of the present invention, the field oxide in step (a) is formed by utilizing a residual portion of the dielectric layer as a mask layer in order that an exposed portion of the pad oxide becomes the field oxide by oxidation.

In accordance with another aspect of the present invention, the field oxide in step (a) is formed by a wet oxidation.

In accordance with another aspect of the present invention, before step (b) the process further includes following steps: (ba1) forming a sacrificial oxide over the field oxide and a residual portion of the dielectric layer in order to eliminate a white ribbon effect resulting from forming the field oxide, and (ba2) removing the sacrificial oxide.

In accordance with another aspect of the present invention, step (b) further includes following steps: (b1) removing the residual portion of the dielectric layer on the active area and eliminating the pad oxide under the residual portion of the dielectric layer, and (b2) growing the gate oxide on the active area.

In accordance with another aspect of the present invention, the residual portion of the dielectric layer and the pad oxide in step (b1) is removed by a wet etching.

In accordance with another aspect of the present invention, the gate oxide in step (b2) is grown by a dry oxidation.

In accordance with another aspect of the present invention, the gate conducting layer in step (c) is a polysilicon.

In accordance with another aspect of the present invention, the gate conducting layer in step (c) is a polycide made of a polysilicon and a silicide.

In accordance with another aspect of the present invention, the silicide is $WSi_x$.

In accordance with another aspect of the present invention, the gate conducting layer in step (c) is formed by a Low Pressure Chemical Vapor Deposition (LPCVD).

In accordance with another aspect of the present invention, the photoresist covered on the p-type MOS region in step (e) and the photoresist covered on the n-type MOS region in step (g) are removed by the same procedure.

In accordance with another aspect of the present invention, the photoresist covered on the n-type MOS region in step (e) and the photoresist covered on the p-type MOS region in step (g) are removed by the same procedure.

In accordance with another aspect of the present invention, as the first ion implantation is being executed, an ion implantation causing the one of the p-type and the n-type MOS regions a punchthrough prevention region is formed upon performing step (e).

In accordance with another aspect of the present invention, the oxide selectively formed by utilizing the Liquid Phase Deposition (LPD) is $SiO_2$ having a thickness of 500–2500 Å.

In accordance with another aspect of the present invention, an operating temperature for executing the Liquid Phase Deposition (LPD) in step (f) is below 40° C.

In accordance with another aspect of the present invention, a $H_2SiF_6$ solution is utilized for executing the Liquid Phase Deposition (LPD) in step (f).

In accordance with another aspect of the present invention, as the second ion implantation is being executed, an ion implantation in the other one of the p-type and the n-type MOS regions a punchthrough prevention region is formed upon performing step (g).

In accordance with another aspect of the present invention, before step (e) the process further includes using a photolithography and an etching technique for removing a portion of the photoresist covered on the one of the p-type and the n-type MOS regions.

In accordance with another aspect of the present invention, step (h) further includes following steps: (h1) removing the oxide on the one of the p-type and the n-type regions, (h2) using a photolithography and an etching technique to remove a portion of the gate conducting layer in order to define a first and a second gate respectively on the p-type and the n-type MOS regions, (h3) forming a first photoresist mask layer on the one of the p-type and the n-type MOS regions and executing a third ion implantation in order to form a first lightly doped drain (LDD) in the other one of the p-type and the n-type MOS regions, (h4) removing the first photoresist mask layer, (h5) forming a second photoresist mask layer on the other one of the p-type and the n-type MOS regions and executing a fourth ion implantation in order to form a second lightly doped drain (LDD) in the one of the p-type and the n-type MOS regions, (h6) removing the second photoresist mask layer, (h7) forming a dielectric layer on the p-type and the n-type MOS regions, (h8) removing a portion of the dielectric layer in order to form a first gate sidewall and a second gate sidewall respectively on the first gate and the second gate, (h9) forming a third photoresist mask layer on the one of the p-type and the n-type MOS regions and executing a fifth ion implantation in order to form a first source and a first drain in the other one of the p-type and the n-type MOS regions, (h10) removing the third photoresist mask layer, (h11) forming a fourth photoresist mask layer on the other one of the p-type and the n-type MOS regions and executing a sixth ion implantation in order to form a second source and a second drain on the one of the p-type and the n-type MOS regions, and (h12) removing the fourth photoresist mask layer.

In accordance with another aspect of the present invention, the CMOS device is an n well device.

In accordance with another aspect of the present invention, the CMOS device is a p well device.

The present invention may be best understood through the following description with reference to the accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

In conventional CMOS device's manufacturing process, a great deal of the photolithography and the etching processes have to be increased for executing the ion implantation in order to regulate the threshold voltage and create the channel stop, accordingly, however, numerous added steps, time and cost have to be further imposed on the sophisticated processes employed previously for manufacturing the CMOS device.

To overcome the shortcoming above mentioned, a Liquid Phase Deposition (LDP) method is thus disclosed by the present invention, in order to enormously reduce the fabricating steps, time and cost for forming a CMOS device having a relatively better quality.

The feature of the LDP method is that there is distinct depositing selectivity according to the present invention for different kinds of materials. In general, the deposition can be occurred on the $SiO_2$ but it will not be taken place on the photoresist, and the deposition can be used as an isolation layer required for the integrated circuit device.

For one of ordinary skill in the art, it is verifiable the present invention is practical. The implementation steps of the LPD method cited herewith are disclosed as follows:

In executing the LPD method, a boat contain therein a chip is put into a reacting container containing therein a reacting liquid made of a saturated $H_2SiF_6$, solution which is kept in its saturation state by continually adding $H_3BO_4$. In addition, the reacting container is further put in a water bath in order that a heater is utilized to heat the reacting container for obtaining a Liquid Phase Deposition Reaction.

Please refer to FIGS. 2(a)–2(h), which implement flow diagrams of a preferred embodiment according to the present invention. In which, the employed CMOS device includes therein a pair of active areas 31 located below a patterned dielectric layer 3 and a silicon substrate 1, the active area 31 is used for forming a p-type and an n-type MOS region. Moreover, the CMOS device has thereon at least one twin tubes that is configured by the p-type MOS region containing therein an n-type well nW and the n-type MOS region containing therein a p-type well pW.

Figure 1A:
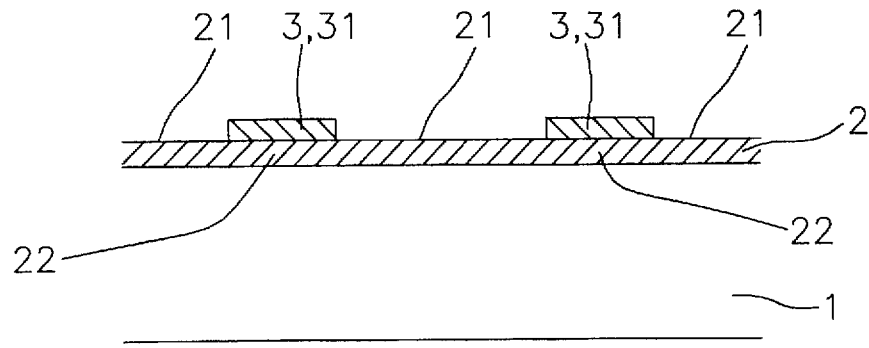
FIGS. 1(a)–1(i) are schematic diagrams showing the conventional processes for manufacturing a CMOS device.
Figure 1B:
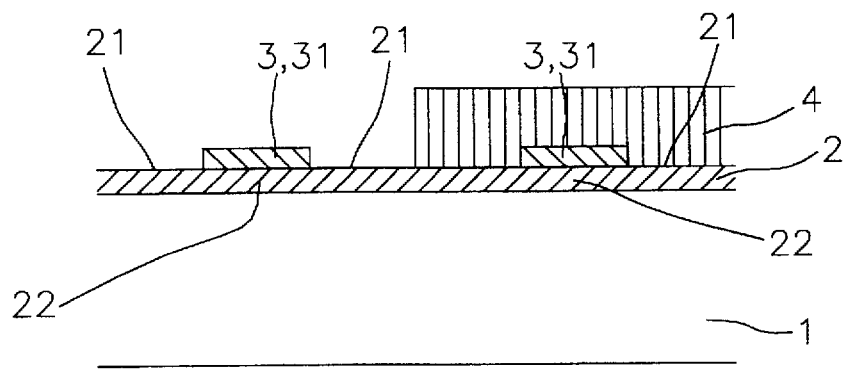
Figure 1C:
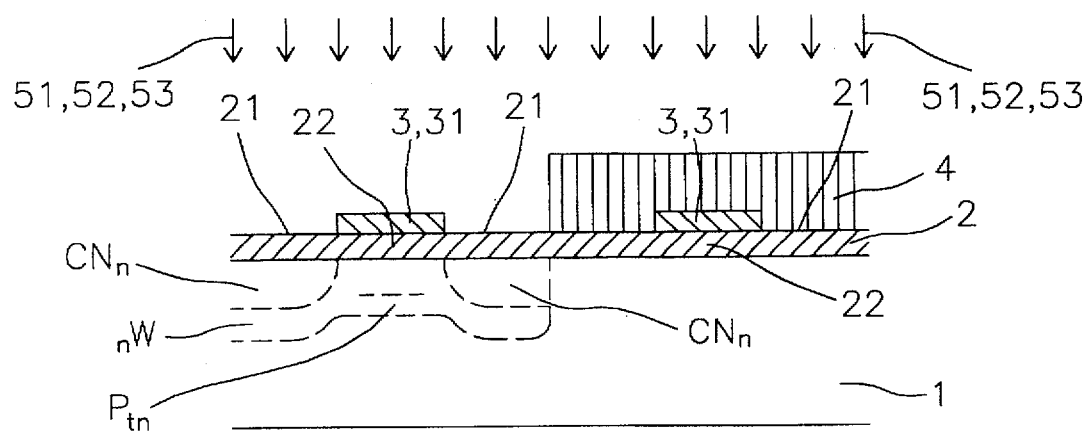
Figure 1D:
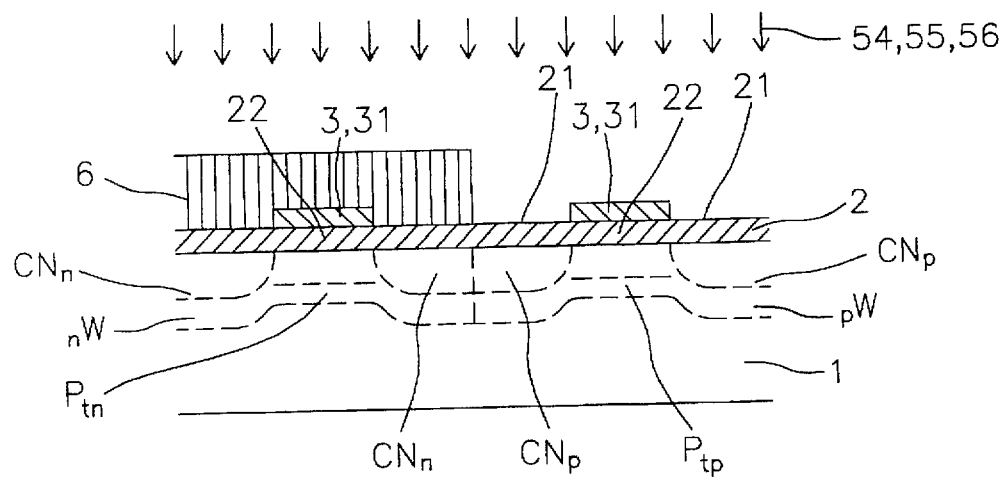
Figure 1E:
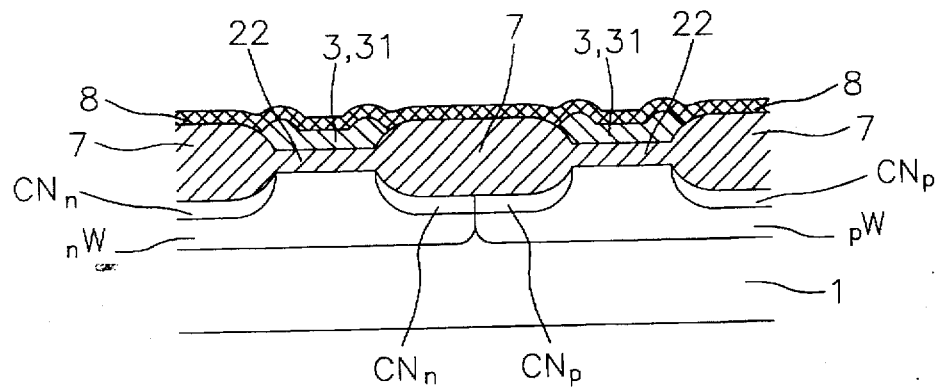
Figure 1F:
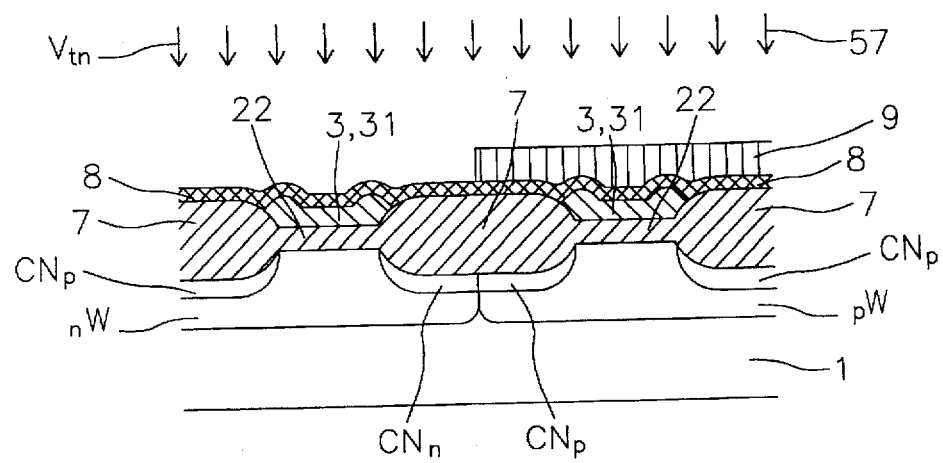
Figure 1G:
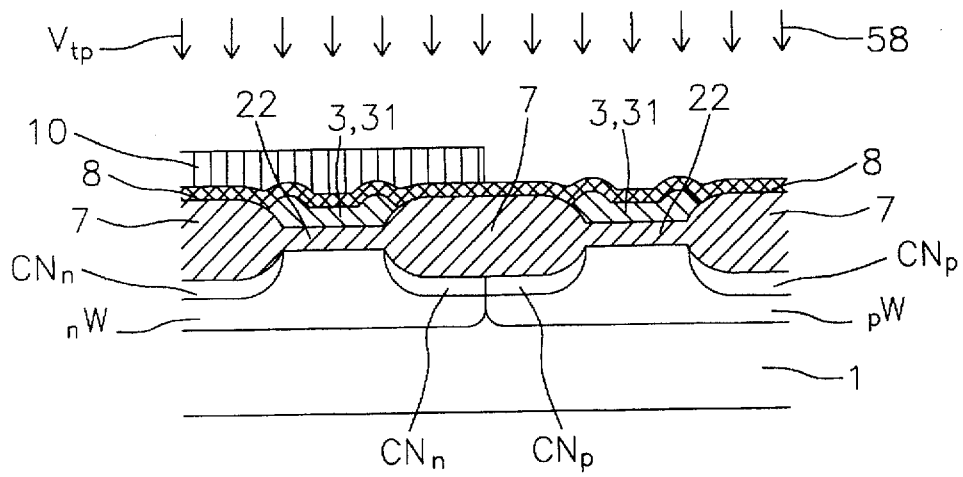
Figure 1H:
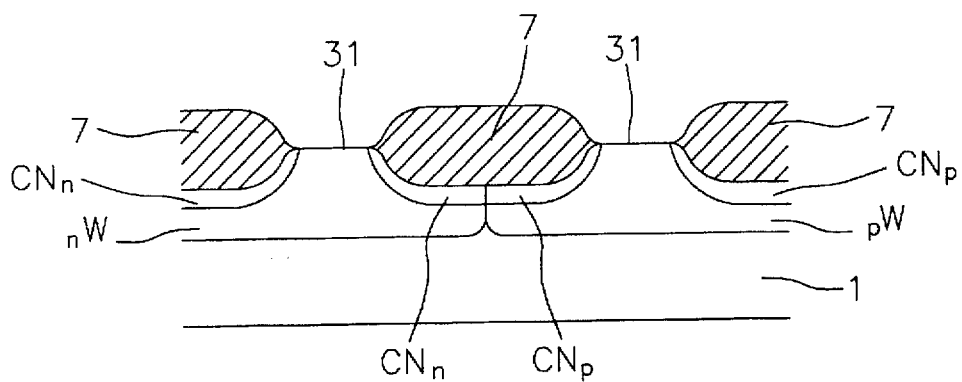
Figure 1I:
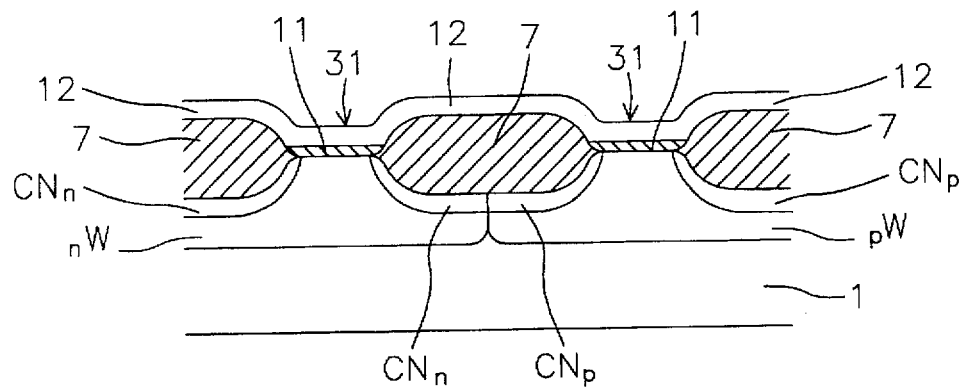
Figure 2A:
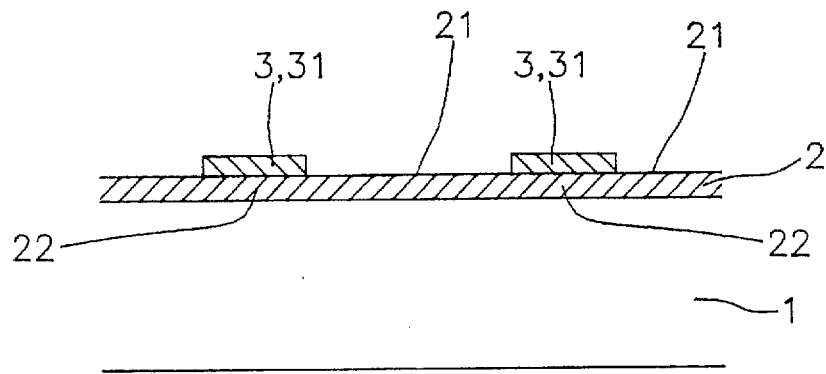
FIGS. 2(a)–2(i) are schematic diagrams showing a preferred embodiment of a process for manufacturing a CMOS device according to the present invention.

FIG. 2(a) contains the following steps:

Utilizing the dry oxidation or wet oxidation to form a pad oxide 2 of a thickness of about one hundred Å to about one thousand Å over the silicon substrate 1;

Employing the Low Pressure Chemical Vapor Deposition (LPCVD) to form a dielectric layer 3 of 1000–2000 Å thickness upon the pad oxide 2, in which the preferred dielectric layer 3 is a $Si_3N_4$ layer; and Using the photolithography and etching technique to remove a portion of the dielectric layer 3 in order to define an active area 31 located beneath the remaining portion of dielectric layer 3.

Figure 2B:
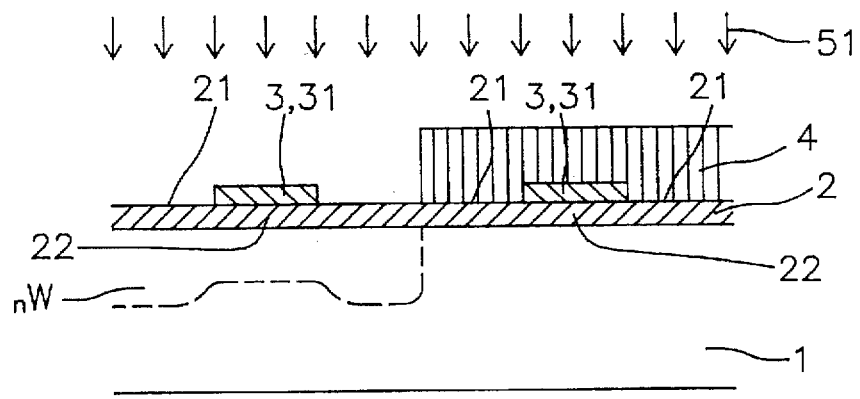

FIG. 2(b) describes that:

Forming a first photoresist mask layer 4 over a portion of the active area 31; and Using the ion implantation technique 51 to pre-deposit the n-type ions in the n well region nW of the silicon substrate 1 which is not masked by the first photoresist mask layer 4. The energy needed for implanting the ions is about 100–2000 KeV, and the employed dosage is around $10^{12}$–$10^{13}$ ions/cm$^2$.

Figure 2C:
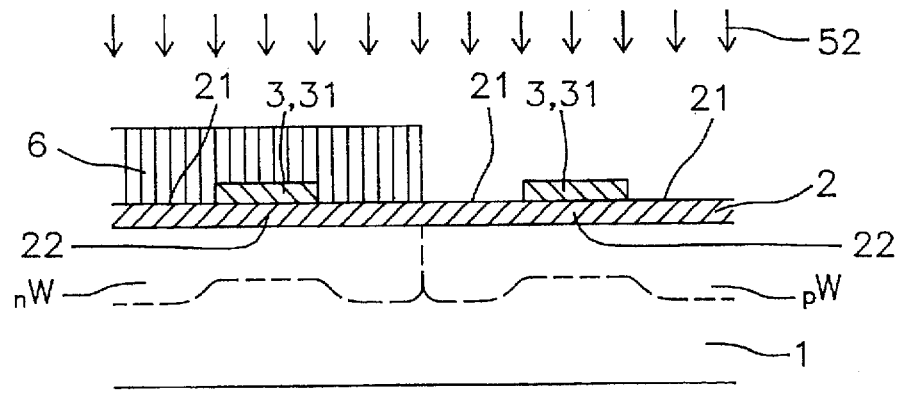

FIG. 2(c) includes the following steps:

Removing the first photoresist mask layer 4 and forming a second photoresist mask layer 6 over a portion of the active area 31 which has not been masked by the first photoresist mask layer 4; and Using the ion implantation technique 52 to pre-deposit the p-type ions in the p well region pW of the silicon substrate 1 which is not masked by the second photoresist mask layer 6. The energy required for implanting the ions is between 100 and 200 KeV, and the used dosage is about $10^{12}$–$10^{13}$ ions/cm$^2$.

Figure 2D:
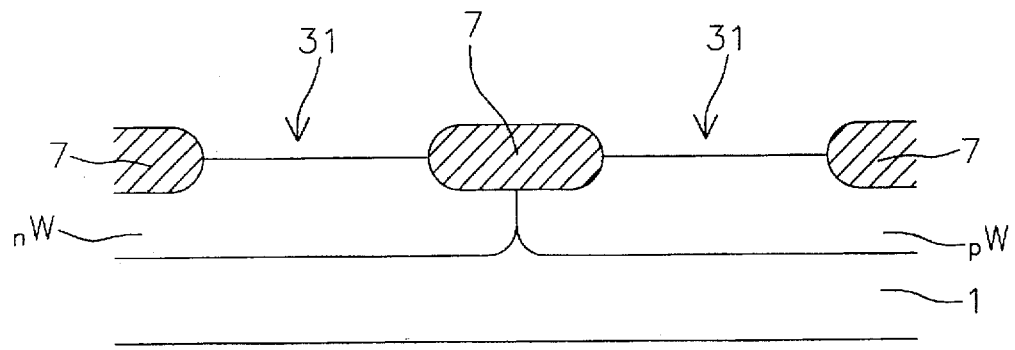

FIG. 2(d) includes the following steps:

Removing the second photoresist mask layer 6 and utilizing the heat diffusion method to perform a drive-in procedure in order that the n-type ion and the p-type ion of the silicon substrate 1 can be respectively diffused to form an n-type well and a p-type well for further respectively forming a p-type MOS region and an n-type MOS region;

A superfluous portion of the dielectric layer 3 is used as a mask in order to cause thereon the exposed pad oxide 21 via oxidation to become a field oxide 7 that functions as an isolation layer by using a wet oxidation method;

Forming a sacrificial oxide, not shown in FIG. 2(d), on the field oxide 7 and the superfluous portion of the dielectric layer 3 in order to eliminate a white ribbon effect occurred during forming the field oxide 7;

Removing the sacrificial oxide; and

Utilizing a wet etching method to remove a residual portion of the dielectric layer 3 on the active area 31 and a portion of the pad oxide 22 under the residual portion of the dielectric layer 3.

Figure 2E:
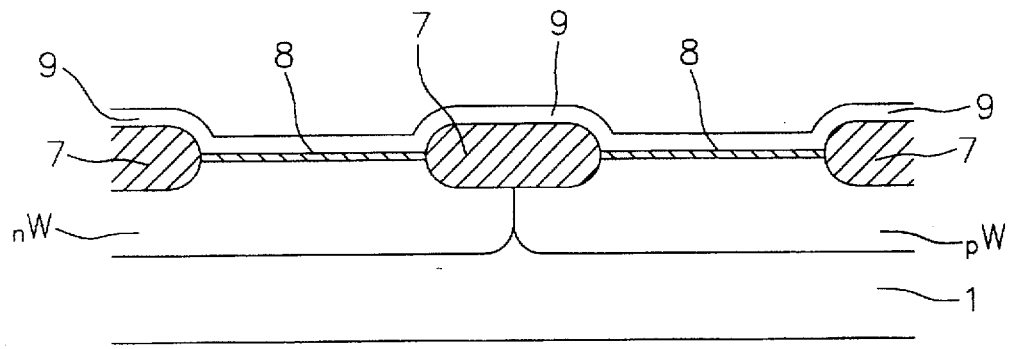

FIG. 2(e) describes the following steps:

Forming a gate oxide 8 over the pair of active areas 31 by utilizing a dry oxidation; and Employing the Low Pressure Chemical Vapor Deposition (LPCVD) method to form a gate conducting layer 9 over the field oxide 7 and the gate oxide 8. In which, the gate conducting layer 9 is a polysilicon or the gate conducting layer is a polycide composed by a polysilicon and a silicide; moreover, a preferred silicide is a $WSi_x$.

Figure 2F:
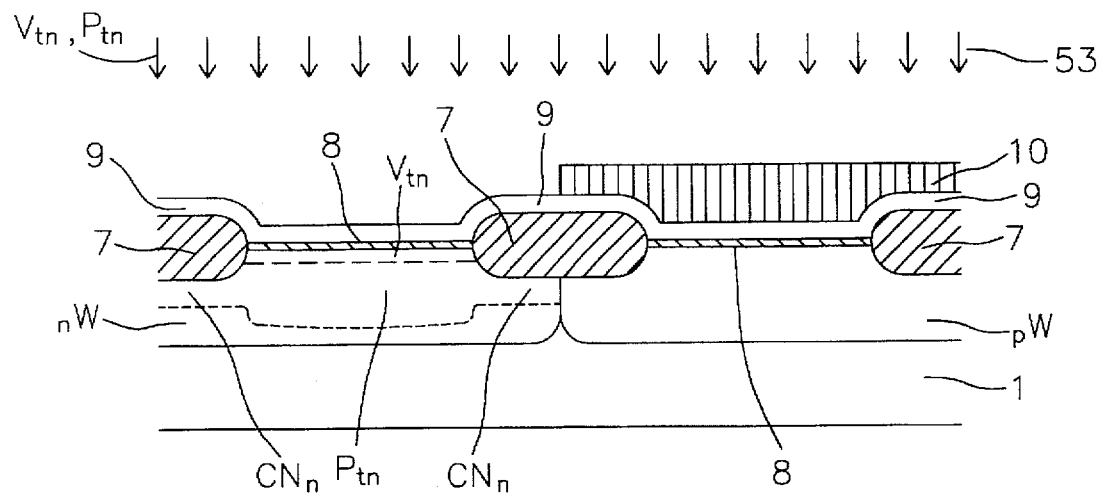

FIG. 2(f) contains the following steps:

Forming a third photoresist mask layer 10 covered on the gate conducting layer 9; and Utilizing the photolithography and the etching technique to remove a portion of the third photoresist mask layer 10 upon one of the p-type or the n-type MOS region, executing a first ion implantation procedure 53 for forming a channel stop CNn for the p-type MOS region, regulating the threshold voltage Vtn and accomplishing an ion Ptn implantation forming thereby a punchthrough prevention region constituting implanted Ptn ions. The energy required for executing the ion implantation to form the channel stop CNn is about several tens KeV, the implanted dosage is around $10^3$ ions/cm$^2$ and the energy used for regulating the threshold voltage via ion implantation is also about several tens KeV; however, the implanted dosage is about $10^2$ ions/cm$^2$.

Figure 2G:
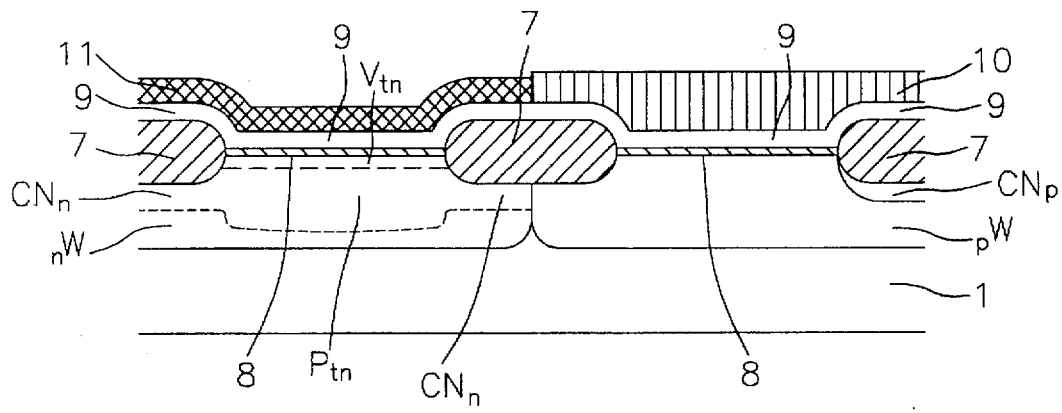

FIG. 2(g) depicts that:

Utilizing a Liquid Phase Deposition (LPD) method under an operation temperature of 40° C. and incorporated with a H2SiF6 solution, a SiO2 layer 11 of 500–2500 Å thickness is selectively formed upon the gate conducting layer 9 of the p-type MOS region.

Figure 2H:
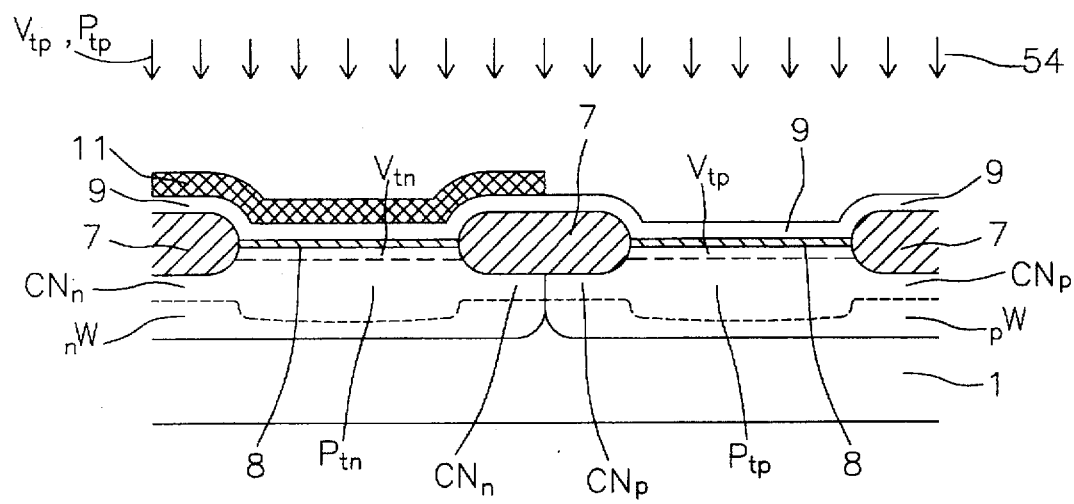

FIG. 2(h) includes the following steps:

Removing the photoresist 10 from the n-type MOS region and executing a second ion implantation procedure 54 for forming a channel stop CNp for the n-type MOS region, regulating the threshold voltage Vtp and implantating Ptp ions to form a punchthrough prevention region. The energy used for performing the ion implantation to form the channel stop CNp is around several tens KeV, the implanted dosage is about $10^3$ ions/cm$^2$ and the energy utilized for regulating the threshold voltage Vtp via ion implantation is also about several tens KeV; however, the implanted dosage is around $10^2$ ions/cm$^2$.

Figure 2I:
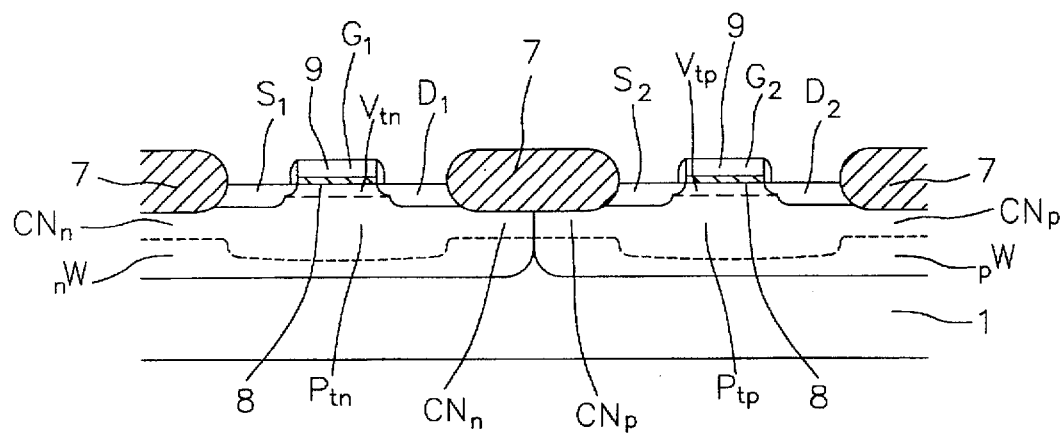

FIG. 2(i) describes that:

Removing the SiO$_2$ layer 11 formed over the p-type MOS region and forming the CMOS device thereon a gate, a source and a drain.

The detailed implementation processes for obtaining a CMOS device having thereon a gate, a source and a drain region as depicted in FIG. 2(i) are described as follows:

Removing the SiO$_2$ layer 11 from the p-type MOS region;

Utilizing the photolithography and the etching technique to eliminate a portion of the gate conducting layer 9 in order to respectively define a first gate G1 and a second gate G2 on the p-type and the n-type MOS regions;

Forming a fourth photoresist mask layer over the n-type MOS region and performing a fifth ion implantation procedure in order to form a first lightly doped drain (LDD) region in the p-type MOS region;

Removing the superfluous portion of the fourth photoresist mask layer;

Forming a fifth photoresist mask layer on the p-type MOS region and executing a sixth ion implantation in order to form a second lightly doped drain (LDD) region in the n-type MOS region;

Eliminating the superfluous portion of the fifth photoresist mask layer;

Forming a dielectric layer over the p-type and the n-type MOS regions;

Removing a portion of the dielectric layer in order to respectively forming a first and a second sidewall on the first and the second gate regions G1 and G2;

Forming a sixth photoresist mask layer over the n-type MOS region and executing a seventh ion implantation procedure in order to form a first source region S1 and a drain region D1 in the p-type MOS region;

Removing the superfluous portion of the sixth photoresist mask layer;

Forming a seventh photoresist mask layer over the p-type MOS region and executing an eighth ion implantation procedure in order to form a second source region S2 and the drain region D2 in the n-type MOS region; and Removing the superfluous portion of the seventh photoresist mask layer.

The implementation processes are not restricted to as recited above, any one of ordinary skill in the art can modify the above described implementation processes for his own convenience.

Additionally, the recited implementation processes are not merely used for a CMOS device having a twin well but also suitably used for a CMOS device having thereon a p well region and/or an n well region.

Hence, the processes disclosed in the present invention can concurrently adjust the characteristics of the PMOS and the NMOS in order to improve the performance of the CMOS device without increasing the number of the processes of the required photolithography and the etching technique.

The method of the present invention is obviously superior to that of the conventional method as merely adjusting the characteristics of the NMOS, under the condition of that the present invention just needs the same numbers of processes of photolithography and the etching technique as that of the conventional method for obtaining a CMOS device having a relatively better quality. On the other hand, less photolithography and etching techniques are required by the present invention via concurrently adjusting the characteristics of the PMOS and the NMOS than that of the conventional method for obtaining a better CMOS device. In addition, only one single ion implantation is needed for the present invention, the characteristics of forming a channel stop and a punchthrough prevention region for promoting the performances of the CMOS device can be concurrently accomplished.

Consequently, the present invention is superior to the conventional method, for it is capable of improving the quality of the CMOS device, saving the time and cost for manufacturing the CMOS device, and accordingly the present invention is a valuable and practical application.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for manufacturing a CMOS device on a silicon substrate, said CMOS device having at least a p-type and an n-type MOS region therein, comprising:

(a) forming an isolation layer to isolate and define a pair of exposed active areas and forming the n-type and p-type MOS regions each under one of the pair of exposed active areas;

(b) forming a gate oxide on said active areas;

(c) forming a gate conducting layer over said gate oxide;

(d) forming a photoresist layer on said gate conducting layer;

(e) removing a portion of said photoresist layer located over one of said p-type and said n-type MOS regions and executing a first ion implantation in order to form a first channel stop in said one of said p-type and said n-type MOS regions and to regulate a first threshold voltage of said one of said p-type and said n-type MOS regions;

(f) selectively forming an oxide layer over said one of said p-type and said n-type MOS regions;

(g) eliminating a remaining portion of said photoresist layer and executing a second ion implantation in order to form a second channel stop on said other one of said p-type and said n-type MOS regions and to regulate a second threshold voltage of said other one of said p-type and said n-type MOS regions; and (h) eliminating said oxide layer on said one of said p-type and said n-type MOS regions and forming gates, sources, and drains in said CMOS device, including patterning and etching said gate conducting layer.

2. A process for manufacturing a CMOS device as claimed in claim 1, wherein said CMOS device has at least one twin well therein, said twin well including an n well and a p well.

3. A process for manufacturing a CMOS device as claimed in claim 2, wherein step (a) includes the following steps:

(a1) forming a pad oxide over said silicon substrate;

(a2) forming a dielectric layer on said pad oxide;

(a3) eliminating a portion of said dielectric layer for defining said active areas; and (a4) forming said n well and said p well on said silicon substrate, each located substantially under one of said active areas.

4. A process for manufacturing a CMOS device as claimed in claim 3, wherein said pad oxide is formed by a heat oxidation.

5. A process for manufacturing a CMOS device as claimed in claim 4, wherein said heat oxidation is one of a dry oxidation and a wet oxidation.

6. A process for manufacturing a CMOS device as claimed in claim 3, wherein a thickness of said pad oxide is in a range from about one hundred Å to about one thousand Å.

7. A process for manufacturing a CMOS device as claimed in claim 3, wherein said dielectric layer is formed by a Low Pressure Chemical Vapor Deposition (LPCVD).

8. A process for manufacturing a CMOS device as claimed in claim 3, wherein said dielectric layer is $Si_3N_4$.

9. A process for manufacturing a CMOS device as claimed in claim 3, wherein a thickness of said dielectric layer in said step (a2) is about 1000–2000 Å.

10. A process for manufacturing a CMOS device as claimed in claim 3, wherein said portion of said dielectric layer in step (a3) is eliminated by a photolithography and an etching technique.

11. A process for manufacturing a CMOS device as claimed in claim 3, wherein said step (a4) further includes the following steps:

(a41) forming a first photoresist mask layer on a first portion of said silicon substrate;

(a42) utilizing an ion implantation for pre-depositing p-type ions in a second portion on said silicon substrate;

(a43) eliminating said first photoresist mask layer and forming a second photoresist mask layer on the second portion of said silicon substrate;

(a44) utilizing an ion implantation for pre-depositing p-type ions in a second portion of said silicon substrate; and (a45) removing said second photoresist mask layer and utilizing a heat diffusion to execute a drive-in process in order that said n-type ions and said p-type ions in said silicon substrate respectively form said n well and said p well by diffusion, defining thereby said p-type and said n-type MOS regions.

12. A process for manufacturing a CMOS device as claimed in claim 3, wherein said field oxide in said step (a) is formed by utilizing a residual portion of said dielectric layer as a mask layer in order that an exposed portion of said pad oxide becomes said field oxide by oxidation.

13. A process for manufacturing a CMOS device as claimed in claim 3, wherein said field oxide in said step (a) is formed by a wet oxidation.

14. A process for manufacturing a CMOS device as claimed in claim 3, wherein before said step (b) said process further includes following steps:

(ba1) forming a sacrificial oxide over said field oxide and a residual portion of said dielectric layer in order to eliminate a white ribbon effect resulting from forming said field oxide; and (ba2) removing said sacrificial oxide.

15. A process for manufacturing a CMOS device as claimed in claim 3, wherein said step (b) further includes the following steps:

(b1) removing the remaining portion of said dielectric layer on said active areas and eliminating said pad oxide under said remaining portion of said dielectric layer; and (b2) growing said gate oxide on said active areas.

16. A process for manufacturing a CMOS device as claimed in claim 15, wherein said residual portion of said dielectric layer and said pad oxide in said step (b1) is removed by a wet etching.

17. A process for manufacturing a CMOS device as claimed in claim 15, wherein said gate oxide in said step (b2) is grown by a dry oxidation.

18. A process for manufacturing a CMOS device as claimed in claim 3, wherein said gate conducting layer in said step (c) is a polysilicon.

19. A process for manufacturing a CMOS device as claimed in claim 3, wherein said gate conducting layer in said step (c) is a polycide made of a polysilicon and a silicide.

20. A process for manufacturing a CMOS device as claimed in claim 19, wherein said silicide is $WSi_x$.

21. A process for manufacturing a CMOS device as claimed in claim 3, wherein said gate conducting layer in said step (c) is formed by a Low Pressure Chemical Vapor Deposition (LPCVD).

22. A process for manufacturing a CMOS device as claimed in claim 3, wherein said photoresist layer covering said p-type MOS region is removed in said step (e) and said photoresist layer covering said n-type MOS region is removed in said step (g).

23. A process for manufacturing a CMOS device as claimed in claim 3, wherein said photoresist layer covering said n-type MOS region is removed in said step (e) and said photoresist layer covering said p-type MOS region is removed in said step (g).

24. A process for manufacturing a CMOS device as claimed in claim 1, wherein as said first ion implantation is being executed in step (e), an ion implantation for preventing punchthrough effects in said one of said p-type and said n-type MOS regions is concurrently accomplished.

25. A process for manufacturing a CMOS device as claimed in claim 3, wherein said oxide layer selectively formed by utilizing said Liquid Phase Deposition (LPD) is $SiO_2$ having a thickness of about 500 to about 2500 Å.

26. A process for manufacturing a CMOS device as claimed in claim 3, wherein an operating temperature for executing said Liquid Phase Deposition (LPD) in said step (f) is below 40° C.

27. A process for manufacturing a CMOS device as claimed in claim 3, wherein a $H_2SiF_6$ solution is utilized for executing said Liquid Phase Deposition (LPD) in said step (f).

28. A process for manufacturing a CMOS device as claimed in claim 3, wherein as said second ion implantation is being executed, an ion implantation for preventing punchthrough effects in said the other one of said p-type and said n-type MOS regions is concurrently accomplished.

29. A process for manufacturing a CMOS device as claimed in claim 2, wherein before said step (e) said process further includes: using a photolithography and an etching technique for removing said portion of said photoresist layer covering said one of said p-type and said n-type MOS regions.

30. A process for manufacturing a CMOS device as claimed in claim 1, a Liquid Phase Deposition (LPD) is used for selectively forming said oxide layer on said conducting layer.

31. A process for manufacturing a CMOS device as claimed in claim 2, wherein said step (h) further includes the following steps:

- (h2) using a photolithography and an etching technique to remove a portion of said gate conducting layer in order to define a first gate and a second gate respectively in said p-type and said n-type MOS regions;
- (h3) forming a first photoresist mask layer on said one of said p-type and said n-type MOS regions and executing a third ion implantation in order to form a first lightly doped drain (LDD) on said other one of said p-type and said n-type MOS regions;
- (h4) removing said first photoresist mask layer;
- (h5) forming a second photoresist mask layer on said the other one of said p-type and said n-type MOS regions and executing a fourth ion implantation in order to form a second lightly doped drain (LDD) in said one of said p-type and said n-type MOS regions;
- (h6) removing said second photoresist layer;
- (h7) forming a dielectric layer on said p-type and said n-type MOS regions;
- (h8) removing a portion of said dielectric layer in order to form a first gate sidewall and a second gate sidewall respectively alongside said first gate and said second gates;
- (h9) forming a third photoresist mask, layer on said one of said p-type and said n-type MOS regions and executing a fifth ion implantation in order to form a first source and a first drain in said other one of said p-type and said n-type MOS regions;
- (h10) removing said third photoresist mask layer;
- (h11) forming a fourth photoresist mask layer on said the other one of said p-type and said n-type MOS regions and executing a sixth ion implantation in order to form a second source and a second drain in said one of said -p-type and said n-type MOS regions; and
- (h12) removing said fourth photoresist mask layer.

32. A process for manufacturing a CMOS device as claimed in claim 1, wherein said CMOS device is an n well device.

33. A process for manufacturing a CMOS device as claimed in claim 1, wherein said CMOS device is a p well device.

* * * * *

UNITED STATES PATENT AND TRADEMARK OFFICE
CERTIFICATE OF CORRECTION

PATENT NO : 5,747,368
DATED : May 5, 1998
INVENTOR(S) : Yang et al.

It is certified that error appears in the above-identified patent and that said Letters Patent are hereby corrected as shown below:

Col. 2, line 20, delete "miniaturized" and insert therefor --miniaturizing--.

Col. 3, line 1, begin new paragraph between "and" and "Executing a sixth . . ."

Col. 3, line 43, delete "miniaturized" and insert therefor --miniaturizing--.

Col. 4, line 66, delete "on" and insert therefor --in--.

Col. 5, line 56, following "performing step (e)." insert (new paragraph) --In accordance with another aspect of the present invention, a Liquid Phase Deposition (LPD) is used for selectively forming the oxide.--

Col. 8, line 25, delete "area" and insert therefor --areas--.

Claims 18, 19, and 21 claim priority to claim 1 instead of claim 3.

Claims 25-28 claim priority to claim 30 instead of claim 3.

Claim 30, line 2, following "claim 1," insert --wherein--.

Claim 31, paragraph (h8), line 4, delete "gates" and insert therefor --gate--.

Signed and Sealed this

Tenth Day of November 1998

*Attest:*

BRUCE LEHMAN

*Attesting Officer*   *Commissioner of Patents and Trademarks*